United States Patent [19]

Pals et al.

[11] Patent Number: 4,622,567
[45] Date of Patent: Nov. 11, 1986

[54] INTEGRATED FET DEVICE HAVING MULTIPLE OUTPUTS

[75] Inventors: Jan A. Pals, Eindhoven; Arend J. Klinkhamer, Nijmegen, both of Netherlands

[73] Assignee: U.S. Philips Corporation, New York, N.Y.

[21] Appl. No.: 607,334

[22] Filed: May 4, 1984

[30] Foreign Application Priority Data

May 9, 1983 [NL] Netherlands ............ 8301629

[51] Int. Cl.[4] .............. H01L 29/78; H01L 27/02
[52] U.S. Cl. .............................. 357/23.1; 357/23.14; 357/24; 357/41; 357/86; 357/42; 357/23.4
[58] Field of Search ............ 357/23.14, 24 M, 24 LR, 357/24 R, 41, 86, 42, 23.1, 23.4

[56] References Cited

U.S. PATENT DOCUMENTS 3,803,461  4/1974  Beneking ............ 352/23.14
4,152,717  5/1979  Satou et al. ............ 357/42
4,213,140  7/1980  Okabe et al. ............ 357/41

OTHER PUBLICATIONS

Beck et al, "High Density Frame Transfer Image Sensor", Jap. Jour. of App. Physics, vol. 22 (1983) Suppl. 22-1, pp. 109-112.

Primary Examiner—Martin H. Edlow
Assistant Examiner—Jerome Jackson, Jr.
Attorney, Agent, or Firm—Robert T. Mayer; Steven R. Biren

[57] ABSTRACT

The invention discloses a compact construction of an n-channel surface MOS source follower in a p-pocket in an n-type substrate. The source is connected to the p-pocket in order to avoid feedback. The drain is connected to the substrate which acts as a supply line. This construction permits manufacturing several output amplifiers with a minimum pitch. The invention is of particular importance for CCD sensors.

9 Claims, 14 Drawing Figures

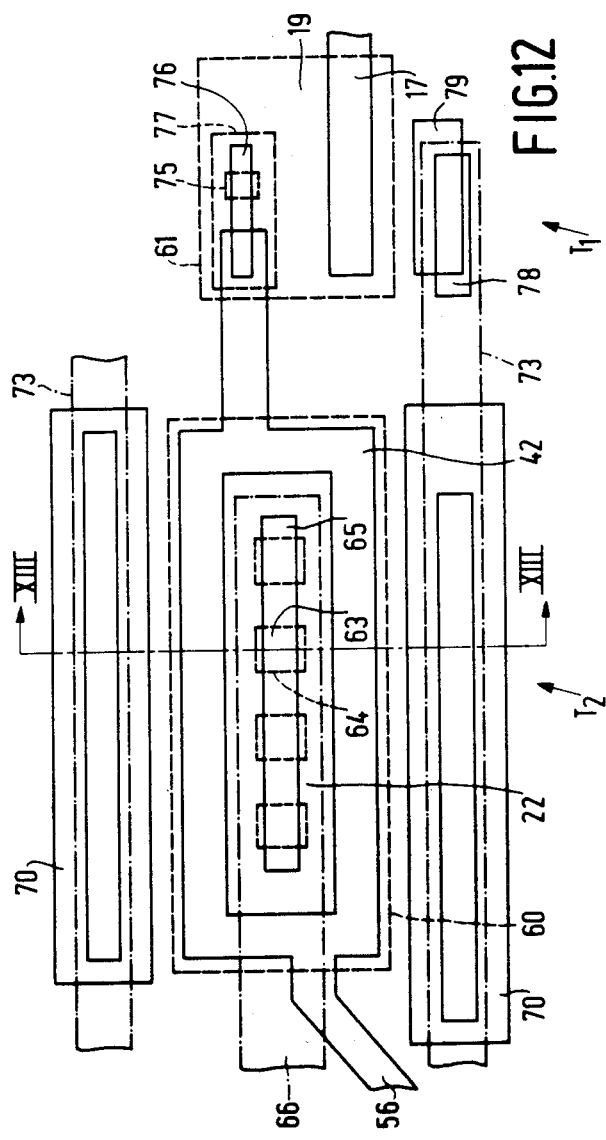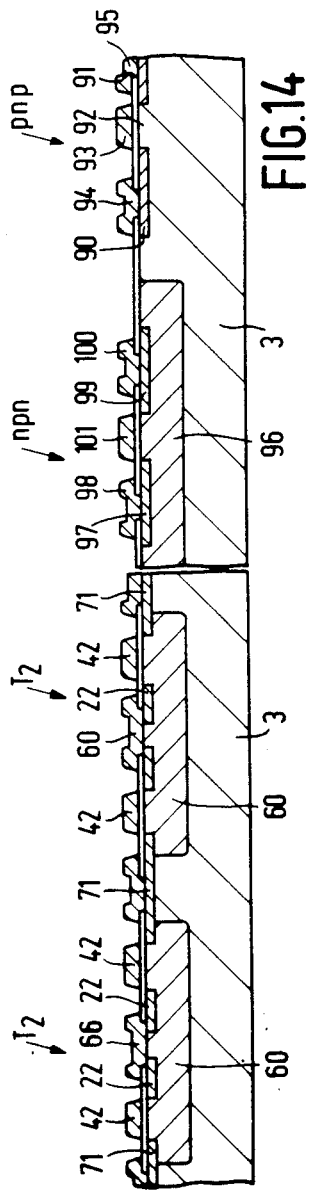

INTEGRATED FET DEVICE HAVING MULTIPLE OUTPUTS

BACKGROUND OF THE INVENTION

The invention relates to a semiconductor device comprising an integrated circuit arranged at a surface of a semiconductor body mainly of the one conductivity type constructed according to an insulated gate field effect device technology, which integrated circuit is provided with a number of output stages for converting signals each having an input for supplying a signal and an output for deriving the transformed signal.

Such a device has been described inter alia in the article "High density frame transfer image sensor", published in "Proceedings of the 14th Conf. (1982, International) on Solid State Devices", Tokyo, Japan, Journal Appl. Phys., 22, Suppl. 22-1, pages 109–112. This known integrated circuit comprises an image sensor arrangement having a system of charge-coupled devices consisting of an image sensor section, a storage section and a reading section. In the image sensor section, an incident image can be converted into a two-dimensional pattern of charge packets. Subsequently, this pattern can be transferred rapidly to the storage section. While a new image is converted into charge in the image sensor section, the frame stored in the storage section can be read line by line by means of the reading registers.

The reading section comprises three horizontal registers arranged successively in a vertical direction instead of a single register, which is common practice. Thus, as described in the aforementioned publication, the pitch between the vertical registers is not unfavorably influenced by the dimensions of the reading section. In the case of a three-color sensor, it is moreover advantageously possible to use a separate reading register for the three components.

In the known device, the semiconductor body is an n-type silicon substrate, which is provided at the upper surface with a p-type surface region (designated as a "pocket" or "well"). The sensor section, the storage section and the reading registers are constructed according to the n-channel bccd or pccd technology and comprise an n-type surface zone provided in the p-type pocket. During operation, the pn junction between the substrate and the p-type pocket can be biased in the reverse direction. Charge carriers (electrons) generated near this pn junction or in the n-type substrate will be drained via the substrate and therefore will not contribute to the formation of charge packets in the sensor section. Smearing due to electrons which are generated deep in the semiconductor body by the red light and would diffuse to the surface in the absence of this pn junction is thus avoided. Since red and infrared light have a lower absorption coefficient than short-wave light and are therefore absorbed to a higher extent than short-wave light at a larger distance from the upper surface, the sensitivity to red and infra-red light will moreover be reduced and will correspond for red light more accurately to the sensitivity to green and blue light, while the sensitivity to infrared light can be reduced to a very low level.

For reading the charge packets, the outputs of the output registers can be connected to three output amplifiers which are integrated together with the image sensor device in the same semiconductor body. For the manufacture of the amplifiers, the same processing steps are preferably used as for the manufacture of the sensor itself. This may be achieved in that the amplifier is composed of n-channel MOS transistors in a p-type pocket. Due to the comparatively high doping concentration of the p-type pocket, such transistors generally have the disadvantage of a high K factor, which is a measure of the feedback of the pocket voltage to the transistor. This feedback can be reduced by connecting the source to the pocket. In this case, however, it is necessary to form a separate pocket for each amplifier. It has been found that, when at least the output transistors of the amplifier are then constructed in the usual manner, the pitch between the amplifiers becomes larger than the pitch between the output registers. Of course, any distance could be realized between the amplifiers by causing the registers to fan out; however, this configuration would occupy additional space in the semiconductor body and is therefore undesirable.

Such problems may also arise in other types of integrated circuits, more particularly CMOS circuits, which are composed of transistors both of the n-type and of the p-type.

SUMMARY OF THE INVENTION

The invention has inter alia for its object to construct the semiconductor device of the kind mentioned above so that the required space in the semiconductor body is reduced.

A semiconductor device according to the invention is characterized in that for each of the said output stages the semiconductor body is provided with a separate surface-adjoining surface region of the second conductivity type, in which an insulated gate field effect transistor is formed comprising a surface-adjoining source zone on the one conductivity type located entirely within the surface region and provided with a source contact which is connected also to the surface region, and a surface-adjoining drain zone of the one conductivity type which is located only in part in the surface region and extends beyond the edge of the surface region into the part of the semiconductor body of the one conductivity type surrounding the surface region, the insulated gate being connected to the input of the output stage and the source contact being connected to the output of the output stage.

Due to the fact that the drain zones can be partly located in the spaces between adjacent pockets and no alignment tolerances are required between the edges of the pockets and the drain zones, such a semiconductor device can be formed occupying less space. Additional saving in space can be obtained in that the adjacent amplifiers are provided with a common drain zone.

BRIEF DESCRIPTION OF THE DRAWING

The invention will be described more fully with reference to the accompanying diagrammatic drawing, in which:

FIG. 12 shows on an enlarged scale in plan view two field effect transistors also shown already in FIG. 7;

FIG. 14 is a sectional view of a second embodiment of a semiconductor device in accordance with the invention.

DESCRIPTION OF THE PREFERRED EMBODIMENTS

Figure 1:
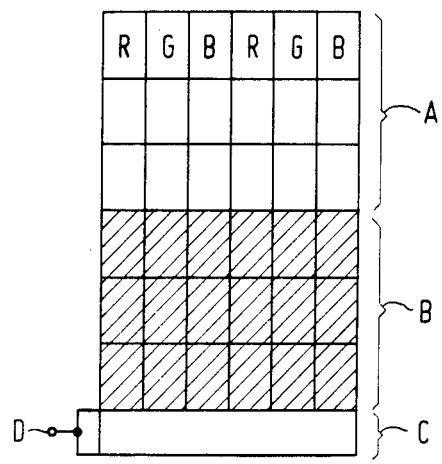
FIG. 1 shows diagrammatically an F.T.Sensor in which the invention is used.

FIG. 1 shows the circuit diagram of an image sensor device of the kind described in the publication mentioned above. The device, which is of the Frame Transfer (F.T.) type, comprises a plurality of adjacent C.T.D. lines extending in the column direction and defining a matrix of charge storage locations. The matrix is subdivided into two parts, the part A of which is the actual sensor part, while the part B is the storage part. The part B may be screened by an Al covering layer from incident light and is therefore indicated by hatched lines. The part C constitutes the horizontal output register, by means of which the information stored in B is transferred line by line to the output D.

In FIG. 1 only six vertical columns and three horizontal lines of the part A or of the part B are shown. However, it will be appreciated that actually the number of columns and lines will be considerably larger. For use in a color camera, the surface may be provided on the side on which the light is incident with a color filter, which comprises, for example, transparent, red (R), green (G) and blue (B) strips which extend over the surface in the column direction. The color filter is not necessary and may be omitted, for example, in the case of a so-called three-chip color camera.

Figure 2:
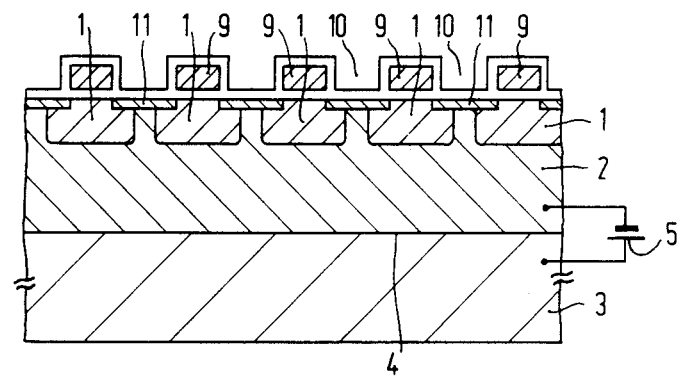
FIG. 2 is a sectional view of the image sensor part of the sensor shown in FIG. 1.

FIG. 2 is a diagrammatic cross-sectional view of the sensor part in a direction at right angles to the charge transport (column) direction. The device is constructed according to n-channel bulk CCD technology (bccd or pccd) and comprises a number of n-type strip-shaped surface zones 1 which constitute the charge transport channels. The thickness and the doping of the zones 1 are such that throughout the thickness of these zones a depletion layer can be formed. The n-type zones are formed in a p-type region 2, which comprises a surface region of the starting semiconductor body, which itself is constituted by an n-type silicon substrate 3, in which the p-type surface region is formed by redoping. The p-type surface region 2 will be designated hereinafter as a "pocket". At a comparatively small distance from the surface of incidence, a pn junction 4 is formed between the pocket 2 and the substrate 3. By means of the voltage source 5, shown diagrammatically, this pn junction can be biased in the reverse direction. Electrons, which are generated at a large distance from the surface with respect to the depth of the zones 1 and which in conventional sensors could reduce the definition of the image by lateral diffusion, are now drained by the substrate 3 and therefore no longer contribute to the formation of charge packets.

There is provided on the surface a clock electrode system 9 which at least in the radiation-sensitive part A leaves free windows 10 through which incident radiation can reach the semiconductor body without being absorbed. For this purpose use may be made of the electrode system as described in the aforementioned publication comprising electrodes arranged at right angles to the charge transport direction and electrodes arranged parallel to the charge transport direction. Alternatively, use may be made of an electrode system as described in Dutch Patent Application No. 8300366, which corresponds to U.S. patent application Ser. No. 573,441. For the storage part B, use may be made of a conventional electrode system.

Between the channels 1 there is arranged at least at the area of the light windows a p-type channel-limiting zone 11 in order to avoid electrons being left beneath the light windows during transport.

The clock electrodes can be manufactured in a manner known per se according to a three-layer polycrystalline silicon technology.

Figure 3:
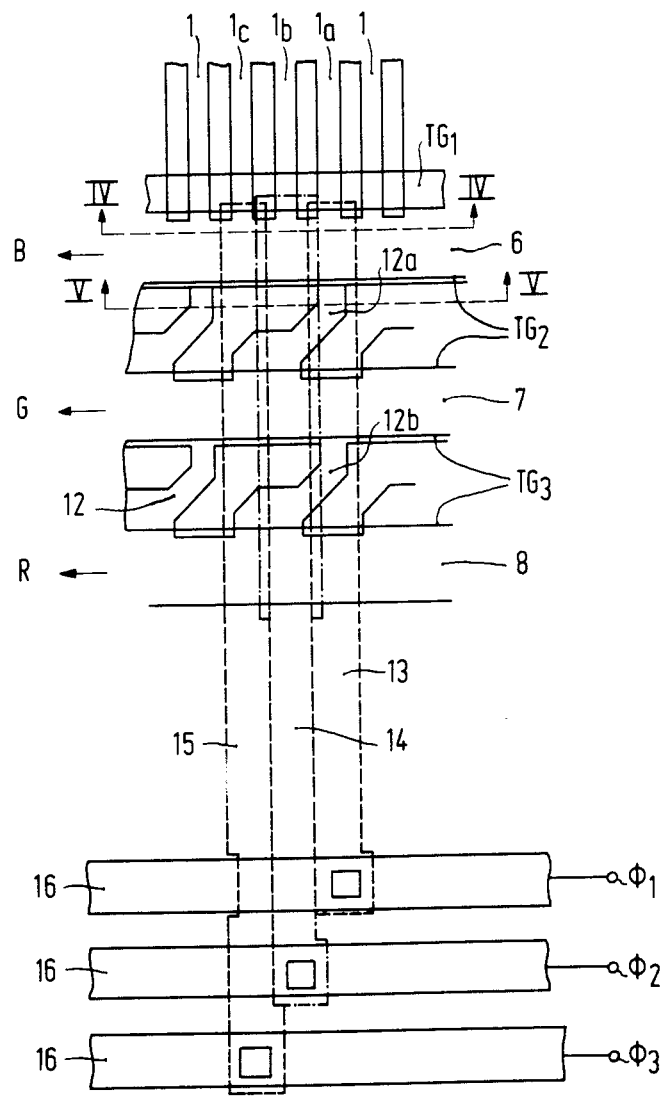
FIG. 3 shows on an enlarged scale the transition between the storage part and the horizontal reading register of the sensor shown in FIG. 1.

FIG. 3 shows diagrammatically in plan view a part of the output register C and the transition between the storage part B and the output register C. The output register C comprises a three-phase CCD which is subdivided into three parallel subchannels 6, 7 and 8. As already stated in the aforementioned publication, this subdivision permits the pitch between the channels 1 of the image sensor part A/storage part B to be chosen with respect to the width of a stage of the horizontal register C such that a maximum resolution in the horizontal direction is obtained. As can be seen in FIG. 3, the pitch between the vertical registers 1 corresponds to the width of a clock electrode of the horizontal register C. Since in the three-phase CCD three electrodes are required for each charge packet, it is necessary to subdivide the register C into three subregisters. Moreover, the device is constructed so that the subregisters 6, 7 and 8 each serve for the charge transport of one of the colors R, G and B, respectively.

Figure 4:
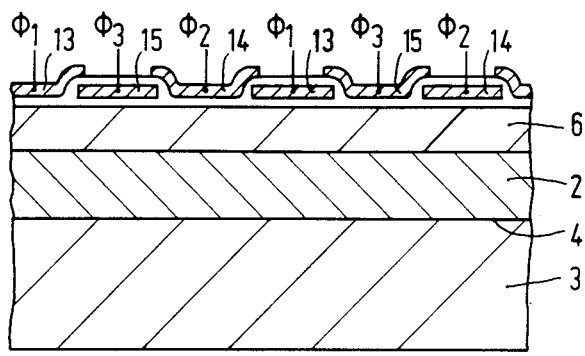
FIG. 4 is a sectional view taken on the line IV—IV in FIG. 3.
Figure 5:
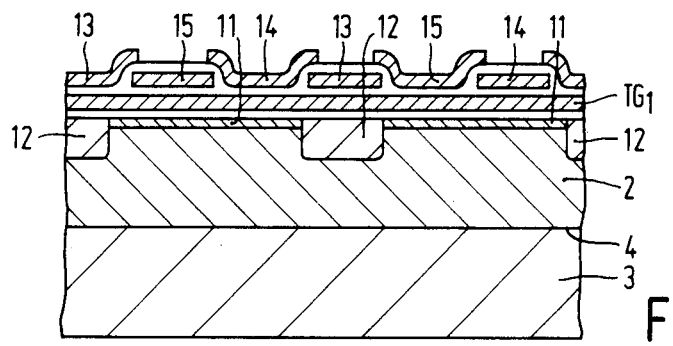
FIG. 5 is a sectional view taken on the line V—V in FIG. 3.

At the transition between the storage part B and the horizontal register C, a transfer gate $TG_1$ (FIG. 3) is arranged, by means of which the transport between the channels 1 and the subregister 6 can be controlled. Between the subchannels 6, 7 and 8 there are formed n-type connection channels 12 for the transport from the subregister 6 to the subregister 7 and from the subregister 7 to the subregister 8. The transport between the subregisters is controlled by the clock electrodes 13, 14 and 15 to which clock voltages $\phi_1$, $\phi_2$ and $\phi_3$ can be applied through the clock lines 16. For the sake of clarity, FIGS. 4 and 5 show two sectional views taken on the lines IV—IV and V—V, respectively. FIG. 4 shows a sectional view of the subregister 6 and FIG. 5 shows a cross-section at the level of the connection channels 12.

The register C is arranged together with the storage part and the sensor part B, A in the p-type pocket 2. The electrodes 13, 14 and 15 and the transfer electrodes $TG_1$, $TG_2$ and $TG_3$ are arranged in a three-layer wiring system of polycrystalline silicon, hereinafter termed "poly". The transfer gates $TG_1$, $TG_2$ and $TG_3$ are arranged in the first (lowermost) layer of poly (poly 1). The electrodes 13–15 are formed in the second and third poly layers (poly 2 and poly 3, respectively). The clock lines 16 may consist of Al.

The clock electrodes in the sensor part A and the storage part B may be formed in the three polycrystalline silicon layers, whereby the last clock electrode of the storage part B should be formed beside the transfer gate TG$_1$ in the second or in the third poly layer.

The charge transport from the storage part B to the horizontal register C and the transport between the sub-registers may be effected in a manner known per se from the technique of charge-coupled devices. Since this transport does not form part of the invention, it will be described herein only briefly. For the transfer of charge from the storage part B, the transfer gate is brought to a positive voltage level (FIG. 3).

When $\phi_1$ is positive, but $\phi_2$ and $\phi_3$ are negative, a first charge packet (electrons), which is stored in the channel 1a is passed to the register 6, beneath the electrode 13. Subsequently, TG$_2$ can be applied to a positive level and $\phi_1$ can be applied to a negative level, as a result of which the said charge packet is stored in the connection channel 12. The charge packet can then be passed to the register 7 by bringing the electrode 14 to a positive level. At the same time, a second charge packet, which is stored in the channel 1b, is transferred to the subregister 6 beneath the electrode 14. The second charge packets can then be passed, by bringing the electrode 13 again to a positive level and by bringing the electrode 14 to a negative level, beneath the electrode 13 and then beneath the electrodes TG$_3$ and TG$_2$ by applying a positive voltage level to TG$_2$ and TG$_3$. From there the first and second charge packets, respectively, can be stored underneath the electrode 15 in the register 8 and the register 7, respectively,. The electrodes 13 and 14 then have a negative voltage, whereas the electrode 15 has a positive voltage. The first and second charge packets, respectively, are then stored underneath the electrode 15 in the register 8 and the register 7, respectively. At the same time, a third charge packet, which is stored in the channel 1c, can be passed beneath the electrode 15 into the subregister 6.

Thus, an entire line can be introduced in three steps into the horizontal register C (6, 7, 8) and can be transported in a manner usual for charge-coupled devices via the subregisters 6, 7 and 8 underneath the output amplifiers.

Figure 6:
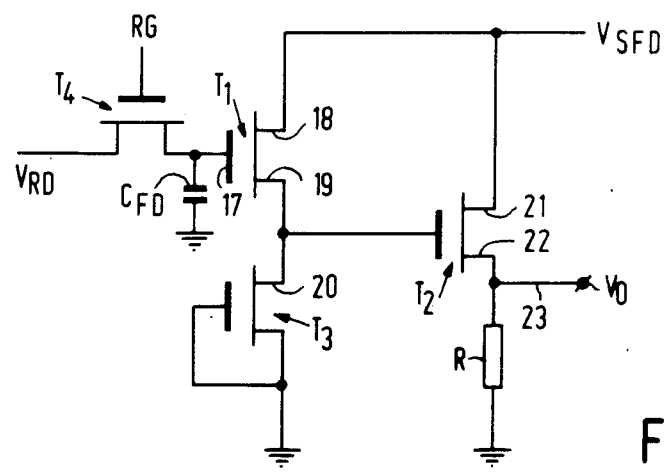
FIG. 6 shows diagrammatically the output stage (power amplifier) used in the sensor shown in FIG. 1.

FIG. 6 shows a circuit diagram of such an output amplifier. The signal (charge packet) is introduced into the capacitor C$_{FD}$ which comprises a floating diode, one plate of which is connected to ground and the other plate of which is connected on the one hand to a reset transistor T$_4$ and on the other hand to the input of a source follower amplifier. The drain of T$_4$, not connected to the capacitor C$_{FD}$, is connected to a fixed voltage V$_{RD}$, as a result of which the signal can be drained after reading. The source follower comprises two stages. The first stage comprises the transistor T$_1$, whose gate 17 constitutes the amplifier input and is connected to the signal-conveying electrode of C$_{FD}$. The drain 18 of T$_1$ is applied to a fixed positive voltage V$_{SFD}$, while the source 19 of T$_1$ is connected to the drain 20 of a transistor T$_3$ connected as a current source. The source 19 of T$_1$ is connected to the input (gate) of the second stage comprising the transistor T$_2$. The drain 21 of T$_2$ is again connected to V$_{SFD}$; the source 22 is connected via a resistor R to ground. The output signal Vo can be derived at the output 23.

Figure 7:
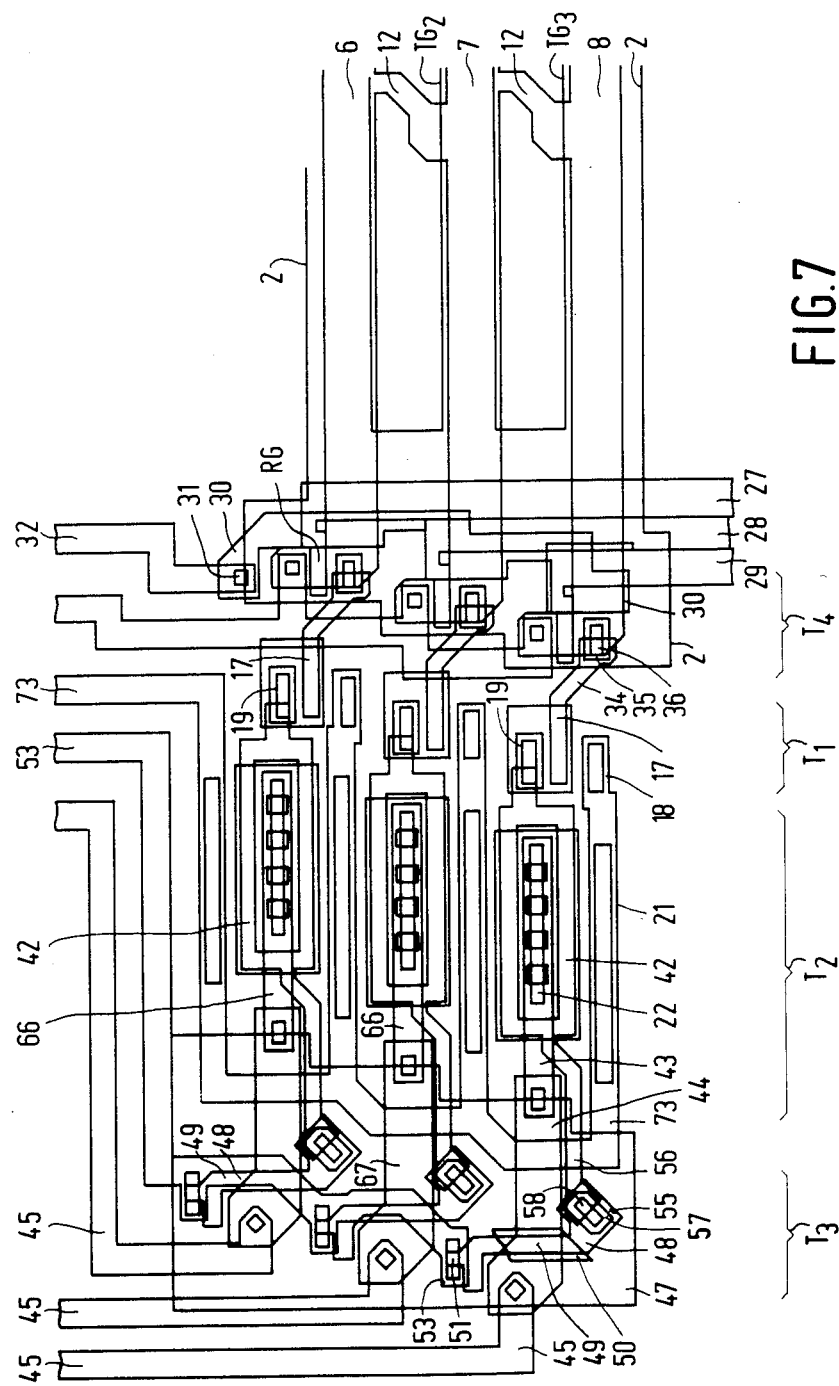
FIG. 7 is a plan view of this output stage as realized in the sensor shown in FIG. 1.

FIG. 7 shows very diagrammatically in plan view a part of the sensor comprising the outputs of the output registers 6, 7 and 8 and the amplifier circuits shown in FIG. 6. The sensor part A and the storage part B are not shown in FIG. 7. In the righthand part of FIG. 7, two further connection channels 12 with the gates TG$_2$ and TG$_3$ are visible. The n-type registers 6–8 are surrounded, as already stated above, by a p-type pocket 2, whose boundary line is designated in FIG. 7 by reference numeral 2. Of the clock electrodes, FIG. 7 only shows the last three electrodes immediately in front of the output of the registers.

Figure 8:
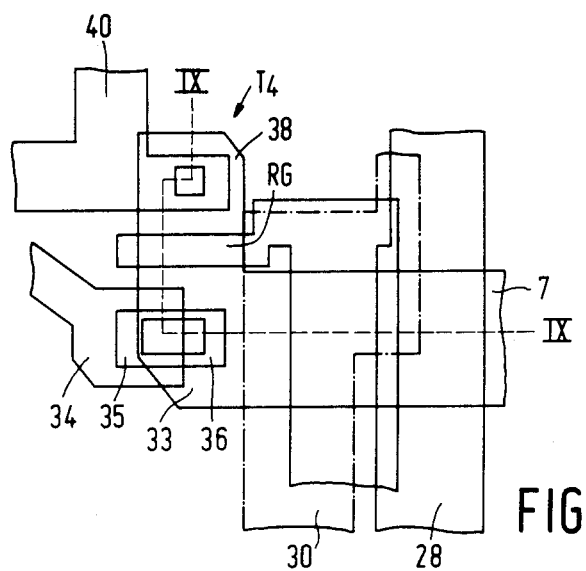
FIG. 8 shows on an enlarged scale the output of a horizontal register shown in the plan view of FIG. 7.
Figure 9:
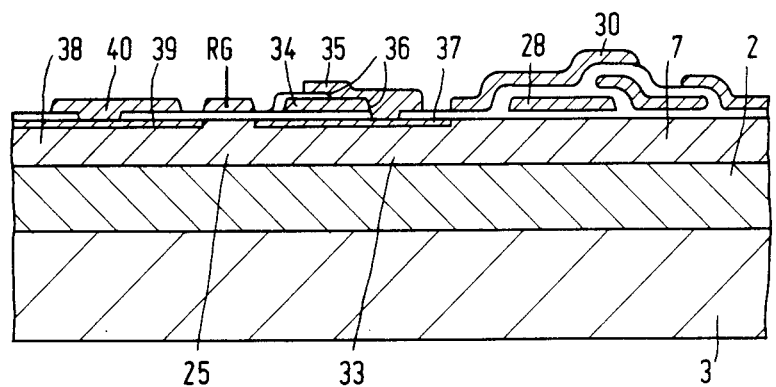
FIG. 9 is a sectional view taken on the line IX—IX in FIG. 8.

For the sake of clarity, FIG. 8 shows on an enlarged scale the output of, for example, the register 7 and FIG. 9 shows a sectional view taken on the line IX—IX in FIG. 8.

In order to simplify the description, for the metallizations the designations poly 1, poly 2, poly 3 and Al will be used hereinafter, where poly 1 designates connections in the lowermost polycrystalline silicon layer, poly 2 designates connections in the central polycrystalline silicon layer, poly 3 designates connections in the uppermost polycrystalline silicon layer and Al designates connections in the Al wiring pattern. If not indicated otherwise, the various connection levels are mutually electrically insulated by an insulating oxide layer.

The outputs of the channels 6, 7 and 8 are L-shaped, whereby the transistors T4 are arranged in the short limb. These transistors are of the depletion type and comprise a deep n-type channel 25 which is constituted by the ends of the channels of the CCD registers. The gate electrodes RG of the field effect transistors T4 are not connected to the last clock electrode of the relevant register 6, 7 or 8. The channels 6, 7 and 8 are not of the same length, but increase, viewed from the upper to the lower side, in length by one phase, such that the signals of the registers are read in order of succession. The gate electrode RG associated with the register 6 is connected to the clock electrode 27, which may be connected to the clock line 16 ($\phi_1$). This gate electrode and this clock electrode may be made of poly 2. The gate RG associated with the central channel 7 may be made together with the clock electrode 28 of poly 1 and may be controlled via this clock electrode and the associated clock line by $\phi_2$. The gate electrode RG of the lowermost transistor T4 is connected to the clock electrode 29 (poly 2) and is controlled by $\phi_3$ via the associated clock line (not shown in FIG. 2/7). Between the field effect transistors T4 and the clock electrodes 27-29 there is arranged an output gate 30 (poly 3), which is connected at the area of the contact 31 to the Al source conductor 32. In FIG. 8, the output gate 30 is indicated for the sake of clarity by a dot-and-dash line. The output gate is applied during operation to a constant voltage at a level between the high and the low levels of the clock voltages $\phi_1$, $\phi_2$ and $\phi_3$. When electrons are stored beneath one of the clock electrodes, for example the clock electrode 28, which is brought to a high voltage level, these charge carriers are automatically transferred to the source zone of T4 when 28 passes to the low voltage level.

The source zones 33 of the field effect transistors T4 are constituted by the part of the channels 6, 7 and 8 which, viewed on the surface, is located between the output gate 30 and the insulated gates RG of T4. The source region 33 is connected through the connection 34 (poly 3) to the gate electrode 17 (poly 3) of the first source followers T1. The connection 34 is connected to the source region 33 through the Al contact 35, which is connected via the overlapping contact window 36 both to the source region 33 and the connection 34. Inter alia in order to obtain a good conducting connection between the Al and the source region 33, a shallow n+ implantation zone 37 is formed in the surface region 33.

The drain region 38 of T4 is connected via the n+ surface zone 39 to the drain electrode 40 (AL). The conductor strip 40 is common, as appears from FIG. 7, to the three transistors T4.

Figure 10:
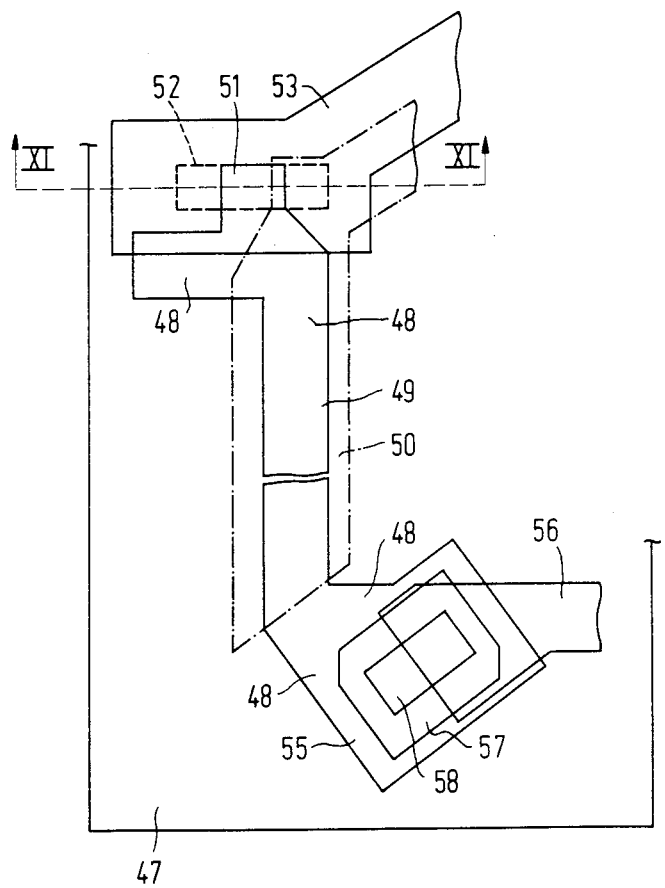
FIG. 10 shows on an enlarged scale a current source shown in the plan view of FIG. 9.
Figure 11:
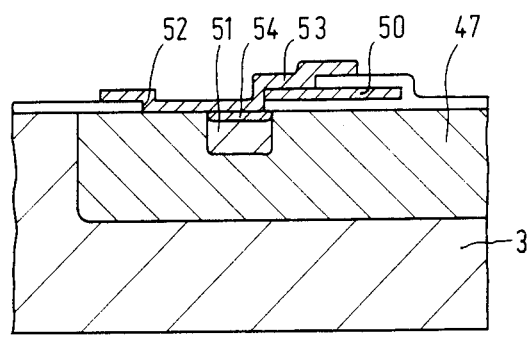
FIG. 11 is a sectional view taken on the line XI—XI in FIG. 10.

As can be seen in FIG. 7, the connection 34 terminates in the gate electrode 17 of the first source follower transistors T1. The drain 18 of the transistors T1 at the same time constitutes the drain 21 of the transistors T2. The source zones 19 of T1 are connected to the gates 42 of the second source followers T2. The construction of the transistors T1 and T2, which is in accordance with the present invention, will be described more fully below, after the most important remaining parts of the output circuit shown in FIG. 7 have first been described. The source zones 22 of the transistors T2 are connected via an Al conductor 43 and the underpasses 44 (poly 3) to Al conductors 45, which lead to output terminals (not shown in FIG. 7). The gate electrodes 42 (poly 2) of the second source follower stages at the same time form connections between the source zones 19 of the transistors T1 and the transistors T3 connected as current sources. In FIG. 10, one of the three transistors T3 is shown on an enlarged scale, for example the transistor T3 of the output amplifier associated with the channel 8. FIG. 11 is a sectional view of this transistor taken on the line XI—XI in FIG. 10. The transistors T3 are n-channel field effect transistors of the depletion type arranged in a p-type pocket 47. The pocket is common to the three transistors T3. The active region of each of the transistors T3 is constituted by an n-type surface zone 48, which can be formed simultaneously with the CCD channels. The channel region is constituted by the parts of the zone 48 shown vertically in FIGS. 7 and 10. The gate electrode 50 (made of poly 2) is indicated in FIG. 10 by dot-and-dash lines. In FIG. 7, only a small part of this electrode is shown for the sake of clarity of the drawing. Actually, this poly strip extends above the channels of the three transistors T3. At the area of the source contact, which is shown in sectional view in FIG. 11, the poly track 50 is connected to the source zone 51. There is formed in the oxide layer covering the sources zones 51 and the poly layer 50 a contact window 52, the contours of which are indicated by broken lines and which overlaps the source zone 51, the poly layer 50 and the p-type pocket 47. The source contact is constituted by the Al layer 53, which interconnects the source zone 51 and the poly electrode 50. As appears from FIG. 7, the Al contact extends upwards and at the same time constitutes source contacts for the remaining transistors T3. The p-type pocket 47 is also contacted via this Al strip 53. Inter alia in order to obtain a good contact between the Al and the n-type source region 51, a shallow highly-doped zone 54 is formed in the source region. The drain zones 55 of the transistors T3 are connected via the connections 56 (poly 2) and the gate electrodes 42 to the source zones 19 of the transistors T1. The connections between the poly tracks 56 and the drain zones 55 are formed by Al dots 57, which contact via contact openings 58, which overlap both the drain zones 55 and the poly tracks 56.

Figure 13:
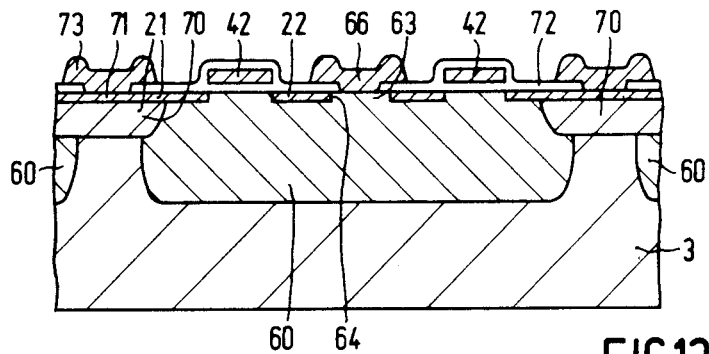
FIG. 13 is a sectional view taken on the line XIII—XIII in FIG. 12.

The poly tracks 56 connect the transistors T3, which act as current sources, to the first source follower transistors T1. As already stated above, these connections extend via the gate electrodes 42 of the second source followers. These second source followers, which should be able to convey a comparatively large current and are proportioned accordingly, are constructed in accordance with the invention so that the pitch between the transistors T2 is practically equal to the pitch between the CCD channels 6, 7 and 8. FIG. 12 shows on an enlarged scale in diagrammatic plan view one of the transistors T2 together with the transistor T1 of the associated first source follower. FIG. 13 is a sectional view of T2. T1 and T2 are field effect transistors having an n-type channel, but in contrast with the transistors T3 and T4, these transistors are of the enhancement type. For each of the transistors T1 and T2, a separate p-type pocket is formed in the semiconductor body. In FIG. 12, these pockets 60 and 61—for the transistors T2 and T1, respectively—are indicated by broken lines. The transistor T2 comprises an n-type source region 22 which is constituted by an n-type surface zone located entirely within the p-type pocket 60. The source zone 22 is provided with openings 63—indicated in FIG. 12 by broken lines—, through which the p-type pocket 60 adjoins the surface. In the oxide layer covering the surface there is formed a contact window 65 through which the pn junction 64 between the p-type pocket 60 and the n-type source zone 22 in the openings 63 is exposed. Through the contact window 65 the source zone 22 is connected to the source contact 66, which is constituted by an Al track and which shortcircuits the pn junction 64 exposed in the contact window 65 and thus also contacts the p-type pocket 60. In FIG. 12, the Al contact 66 is indicated by a dot-and-dash line. Via an underpass 67 (poly 3), the Al track(s) 66 is (are) connected to the Al tracks 45 (FIG. 7), through which the source zones 22 of the transistors T2 can be connected to an output terminal and to an external load element R (FIG. 6), such as, for example, a resistor.

The drain 21 of T2 is located, as can be seen in FIGS. 12 and 13, at least in part outside the p-type pocket 60 and is connected to the n-type substrate 3.

In order to obtain a large W/L ratio, where W designates the width and L the length of the channel, the source zone 22 is constituted by a region centrally arranged in the p-type pocket; the gate electrode and the drain zone extend, viewed on the surface, around this central region.

The transistors T2 can be manufactured by the same processing steps as the remaining part of the device. The p-type pocket 60 can be formed simultaneously with the p-type pocket 2 of the sections A, B and C (at a depth of about 4 μm). The n-type drain zone 21 comprises a deep portion 70, which can be formed simultaneously with the buried CCD channels to a depth of about 1 μm. This zone overdopes at the surface the p-type pocket 60 and prevents at a later stage a shortcircuit between the Al drain contact and the p-type pocket 60. In a next step, the gate electrode 42 made of poly 2 is defined, after which the shallow n+ source zone 22 and the n+ zone 71 forming part of the drain 21 are formed. The n+ zones 22 and 71 are self-registering with respect to the gate electrode 42. These zones are provided with the aid of a mask which defines the openings 63 in the source zone 22. This mask need not be aligned critically with respect to the gate electrode 42. Subsequently, contact holes can be formed in the oxide layer 72, after which the Al source and drain contacts 66 and 73, respectively, can be formed. The Al drain contact 73 at the same time constitutes the drain contact of the associated transistor T1.

It should be noted that in the plan view of FIG. 12 the p-type pocket 60 and the deep n-type drain zones 70 are shown so as to be separated from each other. In fact the mask boundaries are shown in the drawing. By diffusion the boundaries of the zones may be further remote, whereby the p-type pocket 60 is overlapped in part by the deep n-type zone 70, as is illustrated in FIG. 13.

Due to the fact that in a source follower a fixed voltage is applied to the drain, the drain is allowed to project from the p-type pocket 60 and to be connected to the substrate 3. This provides the possibility of small dimensions compared with a MOS transistor in which the drain is entirely located within the pocket. An additional saving in space is obtained in that the three transistors T2 may have at least in part a common drain. This is shown diagrammatically in FIG. 13 by the p-type pockets on the lefthand and the righthand side of the Figure, which, on the assumption that the MOST T2 is associated with the central reading register, comprise the source followers located on either side thereof.

In a practical embodiment of the sensor described herein having 4 $\mu$m wide contact holes and about 5 $\mu$m wide distances between the contact holes and the edge of the gate electrode 42 and a gate electrode about 5 $\mu$m wide, the pitch between the transistors T2 was about 38 $\mu$m, which is also a suitable value for the pitch between the C registers 6, 7 and 8.

The transistor T1 of the first source follower is essentially constructed in the same manner as the transistor T2 described above. The transistors T1, which are likewise of the n-channel type, each comprise a separate p-type pocket 61. The gate electrode 17 is made, for example of poly 3.

The source zone 19 is formed in a self-registering manner simultaneously with the source zone 22 of T2 by means of the mask defining in T2 the pn junction 64 and in T1 the pn junction 75 (FIG. 12). This pn junction is located in the contact window 76 and is shortcircuited by the Al contact 77. This Al dot 77 at the same time connects the source zone 19/p-pocket 61 to the gate electrode 42 of T2. The drain contact 73 of T2 at the same time constitutes the drain contact of T1, which is contacted via the contact opening 78 with the deep n-diffusion 79.

The embodiment described here relates to a Frame Transfer CCD sensor. However, the invention can also be used in a so-called interline sensor, in which the vertical CCD registers are interlined with columns of separate photosensitive elements. The sensor may also be constituted by a so-called x-y system, in which the matrix of photosensitive elements is constituted by MOS transistors arranged in rows and columns.

However, the invention can also be used in other types of semiconductor devices.

FIG. 14 shows by way of example a cross-section of a part of an integrated CMOST circuit comprising both n-channel and p-channel transistors. The device is again provided in an n-type silicon substrate 3 which may have the same thickness and composition as the substrate in the preceding embodiment. The n-channel MOSTs are provided at the surface of this n-type body and are provided in FIG. 14 with the designation pnp. The transistor comprises a p-type source zone 90, a likewise p-type drain zone 91 and an intermediate channel region 92 with an insulated gate 93. The source and drain zones are provided with source and drain contacts 94 and 95, respectively. For the n-channel transistor, designated by npn, a p-pocket 96 is formed in which an n-type source zone 97 provided with a source contact 98 and an n-type drain 99 is provided with a drain contact 100 are formed. Between the source and drain zones is located an insulated gate 101. It should be noted that the drain 99 is located entirely within the p-pocket 96, in contrast with the transistors T2, which are shown in the lefthand part of the Figure. The transistors T2, corresponding parts of which are provided with the same reference numerals as the transistors T2 in the preceding embodiment, each have a closed configuration with a loop-shaped gate electrode 42. At the center of the p-pocket 60 provided for each field effect transistor T2, the n-type source zone 22 is formed, which is provided with the source contact, which is connected also to the associated p-pocket 60. The drain comprises an n+ surface zone 71 which overlaps the edge of the p-pocket 60 and is connected to the n-type substrate 3. The zones 71 and 22 are formed simultaneously with the source and drain zones 97 and 99, respectively, of the n-channel transistor 97, 99, 101. The transistors T2 may also form part of output or amplifier stages. In the embodiment described here, transistors of a conventional configuration are therefore present beside field effect transistors T2. The construction of the conventional transistors 97, 99, 101 provides the possibility of applying a voltage independent of the substrate voltage to the drain of these transistors. On the contrary, the construction the transistors T2 permits of obtaining a larger W/L ratio per unit surface area due to the fact that the drain can be located partly outside the p-pocket and due to the fact that alignment tolerances can be smaller.

It will be appreciated that the invention is not limited to the embodiments described herein, but that many further variations are possible for those skilled in the art within the scope of the invention. For example, the conductivity types may be inverted. Instead of oxide layers, layers of silicon nitride or double layers of different materials may alternatively be used. The metallizations may also consist of materials other than the aforementioned materials.

What is claimed is:

1. A semiconductor device comprising an integrated circuit provided at a surface of a semiconductor body of one conductivity type, constructed in accordance with insulated gate field effect device technology and having a plurality of output stages with output amplifiers for converting signals, each output stage having an input for supplying a signal and an output for deriving the transformed signal, a separate surface-adjoining surface region of the second conductivity type for each output stage provided in said semiconductor body, an insulated gate field effect transistor formed in said surface-adjoining surface region and comprising a surface-adjoining source zone of the one conductivity type located entirely within the surface region and provided with a source contact which is also directly connected to the surface region, a surface-adjoining drain zone of the one conductivity type which is located only in part in the surface region and extends beyond the edge of the surface region into the part of the semiconductor body of the one conductivity type surrounding the surface region, and an insulated gate connected to the input of the output stage, the source contact being connected to the output of the output stage.

2. A semiconductor device as claimed in claim 1, characterized in that the source zone is arranged substantially centrally in the surface region of the second conductivity type and in that, viewed on the surface, the drain zone and the gate electrode have a closed configuration and extend throughout the circumference of the surface region.

3. A semiconductor device as claimed in claim 1 or 2, characterized in that the source zone is provided with openings through which the pn junction between the surface region of the second conductivity type and the source zone of the first conductivity type adjoins the surface and is shortcircuited by means of the source contact.

4. A semiconductor device as claimed in claim 1 or 2, characterized in that the circuit comprises at least two output stages, the surface regions of the second conductivity type associated with these stages being arranged beside each other and the field effect transistors formed in these surface regions having a common drain zone which extends in the two surface regions and in the intermediate part of the semiconductor body.

5. A semiconductor devive as claimed in claim 4, characterized in that the inputs of the output stage are coupled to the output of a number of adjacent charge-transfer devices extending parallel to the surface and substantially parallel to each other in the semiconductor body, the pitch between two adjacent charge-transfer devices being at least in part equal to the pitch between the associated surface regions of the second conductivity type.

6. A semiconductor device as claimed in claim 5, characterized in that the charge transfer devices constitute a reading register of an image sensor device, for which there is formed in the semiconductor body a further surface region of the second conductivity type, in which a number of photosensitive elements are defined, by means of which absorbed electromagnetic radiation can be converted into a number of charge packets of the one type, means being provided by which charge packets thus generated are introduced into said charge-transfer devices for sequentially reading the packets.

7. A semiconductor device as claimed in claim 6, characterized in that the image sensor device comprises a matrix of photosensitive elements arranged in rows and columns and in that the reading registers comprise a group of three adjacent parallel charge-transfer devices, whose charge transport direction is at right angles to the column direction in the matrix, means being provided by which charge packets generated in the matrix are transferred to the reading registers.

8. A semiconductor device as claimed in claim 7, characterized in that the image sensor device is of the frame transfer type and comprises a field of adjacent parallel charge transfer devices, in which the charge transport direction is parallel to the column direction of the matrix, which frame transfer device comprises a sensor section comprising the matrix of photosensitive elements and a storage section located between the sensor section and the reading registers, whereby in the sensor section a trapped image can be converted into a pattern of charge packets, which pattern can be entirely introduced into the storage section and then from the storage section line by line into the reading registers.

9. A semiconductor device as claimed in claim 1 or 2, characterized in that each output stage comprises two series-connected substages, each substage comprising an insulated gate field effect transistor, a signal to be converted being applied to the gate of the transistor of the first substage and via the source zone of this transistor to the gate of the transistor of the second sub-stage, the source zone of the transistor of the first stage being connected to a current source element supplying a current which is applied via the gate of the transistor of the second substage to a transistor of the first substage.

* * * * *